United States Patent [19]
Brakus

[11] Patent Number: 5,835,358
[45] Date of Patent: Nov. 10, 1998

[54] POWER SUPPLY MODULE FOR EQUIPPING AN ASSEMBLY PC BOARD

[75] Inventor: Bogdan Brakus, Stockdorf, Germany

[73] Assignee: Siemens Aktiengesellschaft, Munich, Germany

[21] Appl. No.: 836,090

[22] PCT Filed: Oct. 25, 1995

[86] PCT No.: PCT/DE95/01485

§ 371 Date: Apr. 25, 1997

§ 102(e) Date: Apr. 25, 1997

[87] PCT Pub. No.: WO96/13966

PCT Pub. Date: May 9, 1996

[30] Foreign Application Priority Data

Oct. 27, 1994 [DE] Germany .......................... 94 17 299 U

[51] Int. Cl.⁶ .................................................. H01R 23/68
[52] U.S. Cl. .......................... 361/791; 361/761; 361/764; 361/772; 361/774; 257/692; 257/696; 257/723; 257/724; 174/225; 174/261
[58] Field of Search ..................................... 361/761, 764, 361/772, 774, 773, 791; 257/685, 686, 691, 692, 693, 696, 723, 724; 174/255, 261

[56] References Cited

U.S. PATENT DOCUMENTS

| | | | |
|---|---|---|---|
| 3,201,655 | 8/1965 | Bradt et al. ............................... | 361/744 |
| 3,287,795 | 11/1966 | Chambers et al. ....................... | 361/761 |
| 3,480,836 | 11/1969 | Aronstein ................................. | 361/761 |
| 4,413,308 | 11/1983 | Brown ...................................... | 361/764 |
| 5,095,406 | 3/1992 | Buschmann et al. .................... | 361/774 |
| 5,317,479 | 5/1994 | Pai et al. .................................. | 361/764 |

FOREIGN PATENT DOCUMENTS

| | | | |
|---|---|---|---|
| 37 09 222 | 9/1988 | Germany .......................... | H05K 7/12 |
| 41 16 826 | 5/1991 | Germany .......................... | H03F 1/00 |
| 62-58666 A | 3/1987 | Japan ..................................... | 257/692 |

OTHER PUBLICATIONS

Paten Abstracts of Japan, vol. 18, No. 88 (E–1507) 14 Feb. 1994, & JP 05–292744 dated 05 Nov. 1993.

*Primary Examiner*—Michael W. Phillips
*Assistant Examiner*—John B. Vigushin
*Attorney, Agent, or Firm*—Hill & Simpson

[57] ABSTRACT

The power supply module equips an assembly pc board, whereby the individual elements are arranged on a module pc board. In order to manufacture such a power supply module with little outlay and for reliably solving the heat elimination problems, the active components of the module are mounted in open structure on a ceramic plate manufactured in thick-film technology. The module is thereby mounted either with the components side toward the assembly pc board or within a clearance in the assembly pc board in order to achieve a reliable heat elimination given low structural height.

4 Claims, 2 Drawing Sheets

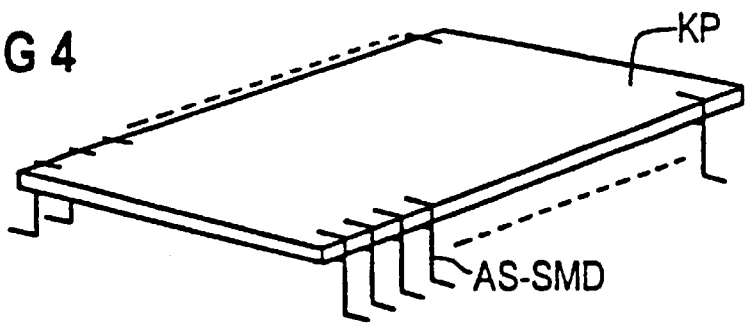
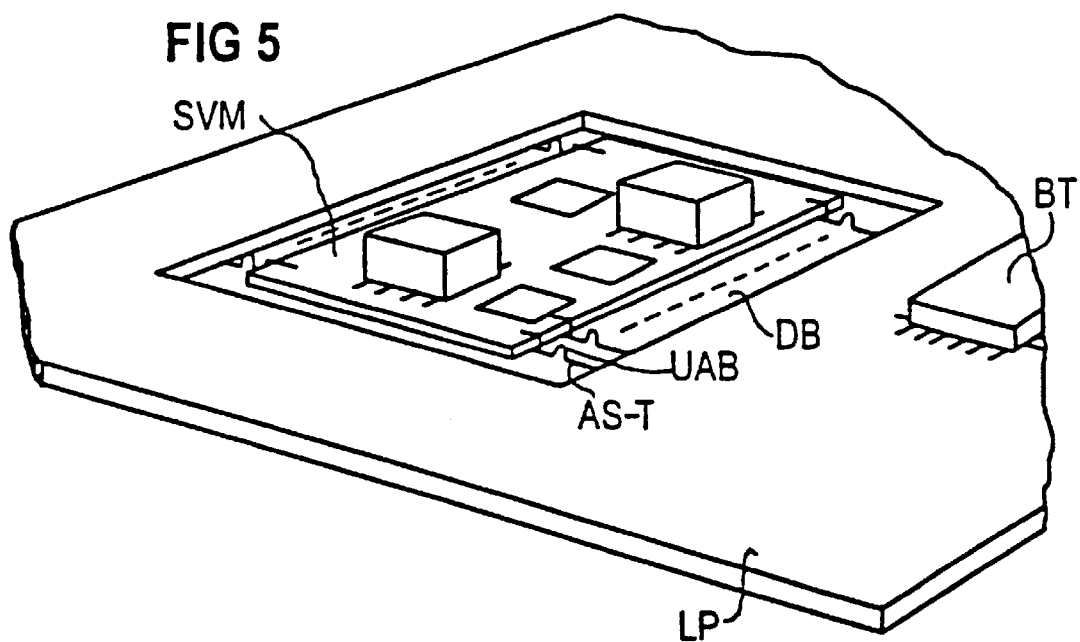
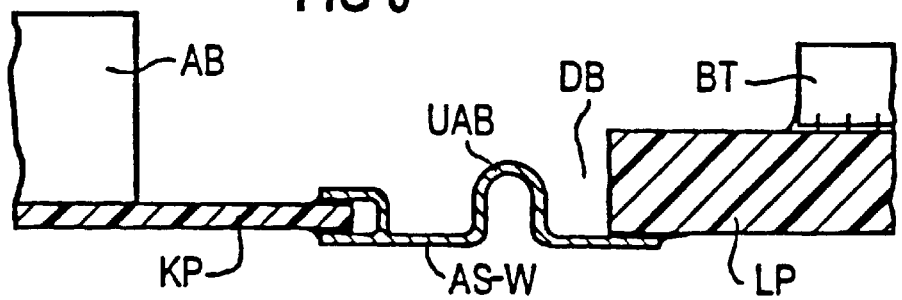

POWER SUPPLY MODULE FOR EQUIPPING AN ASSEMBLY PC BOARD

BACKGROUND OF THE INVENTION

The invention is directed to a power supply module for equipping an assembly pc board, whereby the individual components are arranged on a module pc board.

In modern system technology, DC/DC frequency converters are increasingly accommodated directly on the system assemblies for the supply of electronic circuits.

The typical efficiency of a DC/DC frequency converter amounts to about 80 percent. About 20 percent of the converted power must be eliminated as heat by the converter itself. The dissipated heat mostly arises in the crystal of the power semiconductor. A frequency converter can only be optimized in size when one succeeds in transporting and distributing its dissipated heat from the pronounced "hot spots" to the surface without greater temperature differences. In the ideal case, the surface of the frequency converter is dimensioned exactly according to its dissipated power under predetermined ambient conditions.

In addition to the module size, heat elimination and temperature distribution, further problems such as, for example, weight, assembly outlay, mechanical loads, etc., arise in the realization.

In the standard module technology, electrical components are on one or more small, epoxy printed circuit boards. The heat transport ensues from the "hot spots" via a casting compound to the surface of the housing. In addition to the high manufacturing costs, a considerable added weight thereby arises. The result thereof is a strong stressing of the fastening pins during a transport and due to other vibrations. Additionally, such modules must be mechanically fixed on the printed circuit board (with screws, clamps, etc.), this involving further costs.

In some instances, hybrid technology is applied instead of the epoxy boards. The electrical and mechanical contacting thereby ensues via a few strong terminal pins. For reasons of mechanical stabilization of substrate and terminal pins, such hybrids are accommodated in a housing and cast out. The above-described problems thereby arise. In some embodiments, the stiff terminal pins are stabilized via specific frame structures and fixed to the housing and the substrate.

All of these known techniques involve substantial disadvantages as well as high manufacturing costs. Moreover, such modules are not optimally heated since the lower surface practically always lies on the assembly pc board in order to save structural height. The air throughput is greatly impeded as a result thereof, so that the optimum size of the module cannot be achieved.

SUMMARY OF THE INVENTION

The object of the present invention is comprised in finding an optimum overall solution for the fashioning of such power supply modules.

This object is inventively achieved for a power supply module of the species initially cited in that the active components are arranged in open structure on a ceramic plate produced with thick-film technology that serves as module pc board; in that two rows of adequately thin and long terminal pins are arranged at two opposite edges of the ceramic plate, whereby the spacing between the terminal pins is minimal, and the terminal pins are conducted horizontally away in extension of the underside of the ceramic plate and comprise U-shaped bent-out portions in their middle region; and in that the module is arranged in a clearance of the assembly pc board, whereby the underside of the ceramic plate aligns with the underside of the assembly pc board.

The manufacture of the inventive power supply module can be implemented with low outlay. As a result of the open structure, the heat elimination problems are reliably solved. The power supply module is reliably and elastically carried by the two rows of adequately thin and long terminal pins. Curvatures and deformations of the module pc board caused by heating, mechanical warping, etc., are thereby easily intercepted. Further, the air throughput can occur unimpeded to the farthest-reaching extent. An optimum heat elimination is thereby achieved given a minimal structural height.

The mechanical loading of the power supply module as well as of the contacting is very small due to the low force transmission of the individual, thin and long terminal pin. Over and above this, the electrical contacting via several thin pins is significantly more beneficial than via few terminal with a larger diameter. This technique also directly enables large-area transmission of power.

The power semiconductors are directly applied on the ceramic plate and bonded. The heat transfer resistance of the critical heat sources toward the substrate is thereby minimized. Since the lateral heat distribution in the substrate is very- good, the entire surface of the ceramic plate serves as cooling member. Additional heat transport means such as, for example, a casting compound are thereby superfluous.

At the same time, the height of the power supply module on the system assembly is reduced by the thickness of the printed circuit board itself. The terminal pins are thereby shaped such that they can intercept occurring tangential forces.

An expedient development of the invention is characterized in that the module-side ends of the terminal pins are fashioned fork-shaped and embrace the edges of the ceramic plate at both sides, and in that the terminal pins are bent off toward the equipping side of the module. A reliable connection between terminal pins and ceramic plate of the power supply module is achieved as a result thereof.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIG. 4 is a ceramic plate of a power supply module with terminal pins for an SMD assembly;

FIG. 5 is a power supply module according to the present invention that is mounted in a clearance of an assembly pc board;

FIG. 6 is a partial crossection through the arrangement shown in FIG. 5.

DESCRIPTION OF THE PREFERRED EMBODIMENTS

The power supply module SVM to be mounted on the printed circuit board LP of an assembly is essentially composed of a ceramic plate KP on which the active components AB are mounted. The terminal pins AS-S are attached at two opposite edges of the ceramic plate. The terminal pins AS-S are fashioned adequately thin and long and respectively comprise a minimal spacing. In this way, curvatures and warping of the printed circuit board caused by heating or mechanical stresses are easily intercepted. A more beneficial electrical contacting can also ensue since a large-area delivery of current is possible via a plurality of terminals.

Figure 1:
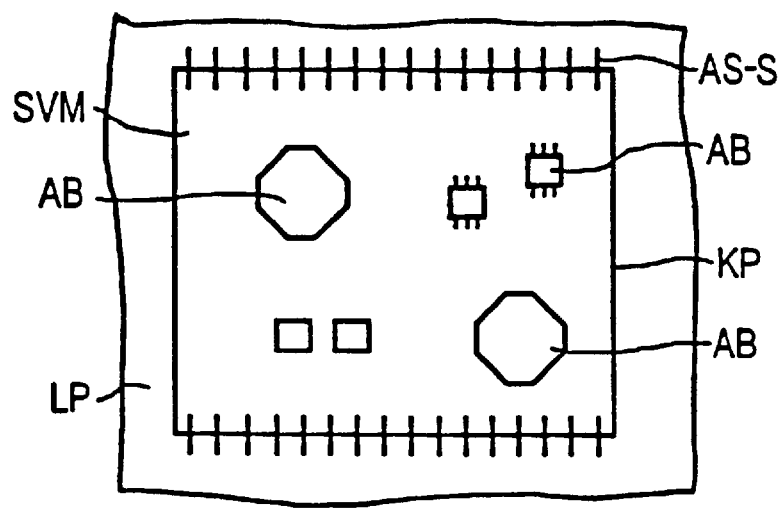
FIG. 1 is a plan view onto a known power supply module that is mounted on an assembly pc board.
Figure 2:
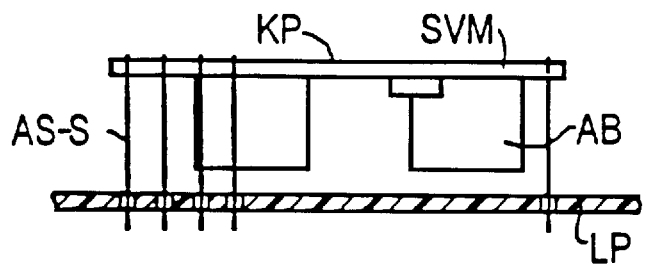
FIG. 2 is a side view of the arrangement shown in FIG. 1.
Figure 3:
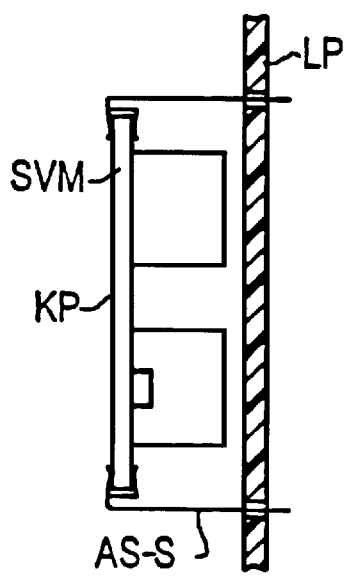
FIG. 3 is another side view of the arrangement shown in FIG. 1.

FIGS. 1 through 3 show a known equipping of the assembly pc board LP with a power supply module SVM (see, for example, Japanese reference JP-A-5 292 744), whereby the equipping side of the power supply module SVM faces toward the surface of the printed circuit board LP in the mounted condition. In this way, a minimal structural height is achieved given good aeration of the active components AB at the same time.

A further reduction of the structural height derives in that, as shown in FIG. 5 and in FIG. 6, the inventive power supply module SVM is arranged within a clearance DB of the printed circuit board LP. In this embodiment, the structural height of the power supply module in the built-in condition is reduced by the thickness of the printed circuit board LP. In this embodiment, the terminal pins AS-W are horizontally guided in extension of the underside of the ceramic plate KP and comprise U-shaped bent-out portions. What is achieved as a result of the U-shaped bent-out portions UAB is that the occurring tangential forces can be intercepted.

In order to achieve a reliable connection of the terminal pins AS-S and AS-W the module-side ends of these terminal pins are fashioned fork-shaped in order to embrace the edges of the ceramic plate KP at both sides.

FIG. 4 shows a ceramic plate KP of an inventive power supply module wherein the terminal pins AS-SMD are suitable for an SMD assembly.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A power supply module for equipping an assembly pc board, individual components being arranged on a module pc board, comprising:

active components arranged in open structure on a ceramic plate produced with thick-film technology that serves as module pc board;

two rows of thin and long terminal pins arranged at first and second opposed edges of the ceramic plate, spacing between the terminal pins of each edge being minimal and the terminal pins being conducted horizontally away in extension of an underside of the ceramic plate and each of the terminal pins having a U-shaped bent-out portion in a middle region thereof; and the power supply module being arranged in a clearance of the assembly pc board, the underside of the ceramic plate being aligned with the underside of the assembly pc board.

2. The power module according to claim 1, wherein module-side ends of the terminal pins have a fork-shaped configuration and embrace the edges of the ceramic plate at both sides of the edges; and wherein the terminal pins are bent off toward an equipping side of the power supply module.

3. A power supply module system, comprising:

a printed circuit board having individual components;

a power supply module having active components arranged in open structure on a ceramic plate produced with thick-film technology;

first and second rows of thin and long terminal pins arranged at first and second opposed edges, respectively, of the ceramic plate, spacing between terminal pins of each edge being minimal and the terminal pins being conducted horizontally away in extension of an underside of the ceramic plate;

each of the terminal pins having a U-shaped bentout portion in a middle region thereof; and the power supply module being arranged in a clearance of the printed circuit board, the underside of the ceramic plate being aligned with an underside of the assembly printed circuit board.

4. The power supply module system according to claim 3, wherein module-side ends of the terminal pins have fork-shaped configurations and embrace the edges of the ceramic plate at both sides of the edges; and wherein the terminal pins are bent toward an equipping side of the power supply module.

* * * * *